United States Patent
Kim et al.

(10) Patent No.: US 10,061,641 B2
(45) Date of Patent: Aug. 28, 2018

(54) MEMORY CONTROLLER, STORAGE DEVICE INCLUDING THE SAME AND DATA ENCODING AND DECODING METHODS THEREOF

(71) Applicant: Samsung Electronics Co., Ltd., Suwon-Si, Gyeonggi-Do (KR)

(72) Inventors: Namshik Kim, Seoul (KR); Tae-Hwan Kim, Suwon-si (KR); Daewook Kim, Osan-si (KR); Biwoong Chung, Yongin-si (KR); Junjin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/580,815

(22) Filed: Dec. 23, 2014

(65) Prior Publication Data

US 2015/0178155 A1  Jun. 25, 2015

(30) Foreign Application Priority Data

Dec. 23, 2013  (KR) .................... 10-2013-0161731

(51) Int. Cl.
*G06F 11/10* (2006.01)
*G11C 29/52* (2006.01)
*G11C 11/419* (2006.01)

(52) U.S. Cl.
CPC ........ *G06F 11/1012* (2013.01); *G11C 11/419* (2013.01)

(58) Field of Classification Search
CPC .. G11C 11/419; G06F 11/1012; H03M 13/09; H03M 13/1128; H03M 13/116; H03M 13/2906; H03M 13/2927
See application file for complete search history.

(56) References Cited

U.S. PATENT DOCUMENTS

| | | | |
|---|---|---|---|
| 6,052,815 | A | 4/2000 | Zook |
| 7,225,387 | B2 | 5/2007 | Lin et al. |
| 7,559,008 | B1 | 7/2009 | Patapoutian |
| 7,590,916 | B2 | 9/2009 | Katashita et al. |
| 7,810,014 | B2 | 10/2010 | Kim et al. |
| 8,112,689 | B2 | 2/2012 | Hong et al. |
| 8,140,935 | B2 | 3/2012 | Hong et al. |
| 8,261,175 | B2 | 9/2012 | Wang et al. |

(Continued)

OTHER PUBLICATIONS

Yeong-Hyeon Kwon et al., "A New LDPC Decoding Algorithm Aided by Segmented Cyclic Redundancy Checks for Magnetic Recording Channels", IEEE Transactions on Magnetics, vol. 41, No. 7, Jul. 2005, p. 2318~2320.

(Continued)

*Primary Examiner* — Kyle Vallecillo
(74) *Attorney, Agent, or Firm* — Harness, Dickey & Pierce, P.L.C.

(57) ABSTRACT

A storage device is provided which includes an ECC circuit. At a write operation, the ECC circuit generates a CRC (cyclic redundancy check) parity corresponding to data and generates an ECC (error correction code) parity corresponding to the data using an error correction code. At a read operation about the data stored in the at least one nonvolatile memory device, the ECC circuit corrects an error of the data using the CRC parity and the ECC parity.

10 Claims, 16 Drawing Sheets

(56) References Cited

U.S. PATENT DOCUMENTS

| | | | |
|---|---|---|---|
| 8,284,833 B2 | 10/2012 | Jin et al. | |
| 8,291,298 B2 | 10/2012 | Lo et al. | |
| 8,352,829 B1 | 1/2013 | Pathakota | |
| 2004/0049726 A1* | 3/2004 | Goyins | H03M 13/091 714/758 |
| 2005/0005145 A1* | 1/2005 | Teixeira | G06F 21/606 713/193 |
| 2005/0172205 A1 | 8/2005 | Lin et al. | |
| 2007/0118790 A1 | 5/2007 | Kim et al. | |
| 2007/0136411 A1 | 6/2007 | Katashita et al. | |
| 2008/0163023 A1 | 7/2008 | Hong et al. | |
| 2009/0077457 A1* | 3/2009 | Ramesh | H03M 13/2975 714/807 |
| 2010/0125777 A1 | 5/2010 | Wang et al. | |
| 2010/0185914 A1 | 7/2010 | Tan et al. | |
| 2010/0281337 A1 | 11/2010 | Lo et al. | |
| 2011/0246857 A1 | 10/2011 | Bae et al. | |
| 2011/0264985 A1 | 10/2011 | Jin et al. | |
| 2012/0011416 A1 | 1/2012 | Hong et al. | |
| 2012/0233518 A1 | 9/2012 | Lee et al. | |
| 2013/0031440 A1* | 1/2013 | Sharon | G06F 11/1012 714/758 |
| 2013/0073895 A1 | 3/2013 | Cohen | |
| 2013/0173985 A1 | 7/2013 | Chung et al. | |
| 2013/0246839 A1 | 9/2013 | Werner et al. | |

OTHER PUBLICATIONS

Barg, Alexander et al., "Concatenated Codes: Serial and Parallel", IEEE Transactions on Information Theory, vol. 51, No. 5, May 2005, p. 1625~1634.

Wu, Jinhong et al. "Stopping Criteria for Iterative Decoding based on Mutual Information", arXiv:1302.1461v1 [csIT] Feb. 6, 2013.

Wang, Renqiu et al., "CRC-Assisted Error Correction in a Convolutionally Coded System", IEEE Transactions on Communications, vol. 56, No. 11, Nov. 2008, p. 1807~1815.

Ascenso, Joao et al., "Complexity Efficient Stopping Criterion for LDPC Based Distributed Video Coding", Proc. ICST, Sep. 2009.

* cited by examiner

FIG. 3
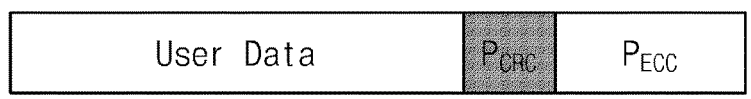
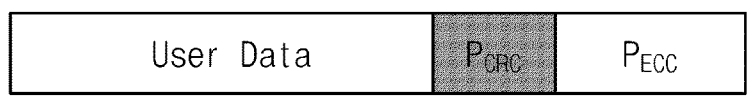
FIG. 4
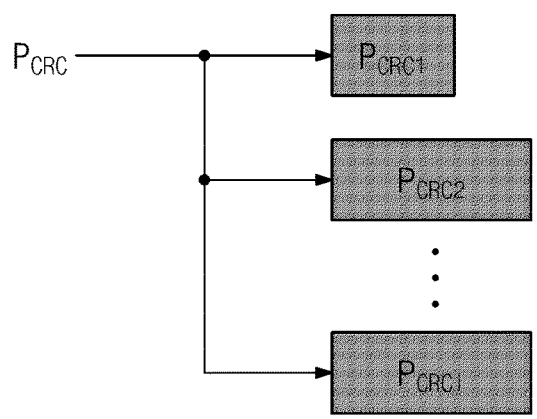

MEMORY CONTROLLER, STORAGE DEVICE INCLUDING THE SAME AND DATA ENCODING AND DECODING METHODS THEREOF

CROSS-REFERENCE TO RELATED APPLICATIONS

This U.S. non-provisional patent application claims priority under 35 U.S.C. § 119 to Korean Patent Application No. 10-2013-0161731 filed Dec. 23, 2013, the subject matter of which is hereby incorporated in its entirety by reference.

BACKGROUND

Example embodiments of the inventive concepts relate generally to a memory controller, a storage device including the same and encoding and decoding methods thereof.

A semiconductor memory device may be volatile or nonvolatile. The volatile memory device may include dynamic random access memory (DRAM), static RAM (SRAM), etc. The nonvolatile memory device may include Electrically Erasable Programmable ROM (EEPROM), Ferroelectric RAM (FRAM), Parallel RAM (PRAM), magnetoresistive RAM (MRAM), flash memory, etc. The volatile memory device may lose data stored therein at power-off, however, the nonvolatile memory device may retain the data stored therein even at power-off. Of the nonvolatile memory devices, the flash memory may have advantages such as high-speed programming, low power consumption, mass storage, and the like. Thus, a flash memory based storage device is widely used. The flash memory based storage device includes a solid state drive replacing a hard disk and memory cards, for example, a Secure Digital (SD) card or a MultiMediaCard (MMC).

SUMMARY

Some example embodiments of the inventive concepts are directed to a storage device.

In some example embodiments, the storage device includes at least one nonvolatile memory device; and a memory controller configured to control the at least one nonvolatile memory device and including an ECC circuit, wherein at a write operation, the ECC circuit generates a CRC (cyclic redundancy check) parity corresponding to data and generates an ECC (error correction code) parity corresponding to the data using an error correction code, wherein at a read operation about the data stored in the at least one nonvolatile memory device, the ECC circuit corrects an error of the data using the CRC parity and the ECC parity, and wherein the CRC parity includes a plurality of CRC parities generated by a concatenation manner using a plurality of CRC polynomials based on CRC parity information or is generated on one selected from the plurality of CRC polynomials based on the CRC parity information.

Other example embodiments of the inventive concepts are directed to a data encoding method of a storage device which includes a nonvolatile memory device and a memory controller controlling the nonvolatile memory device.

In some example embodiments, the data encoding method includes receiving data; generating a CRC parity about the data based on CRC parity information; and generating an ECC parity about the data using an error correction code. The CRC parity includes a plurality of CRC parities generated by a concatenation manner using a plurality of CRC polynomials based on CRC parity information or is generated by using one selected from the plurality of CRC polynomials based on the CRC parity information.

Other example embodiments of the inventive concepts are directed to provide a data encoding method of a storage device which includes a nonvolatile memory device and a memory controller controlling the nonvolatile memory device.

In some example embodiments, the data encoding method includes receiving data; generating a first code word with a variable CRC parity; and generating a second code word corresponding to the first code word using an error correction code, wherein the CRC parity includes a plurality of CRC parities generated by a concatenation manner using a plurality of CRC polynomials based on CRC parity information or is generated by using one selected from the plurality of CRC polynomials based on the CRC parity information.

Some example embodiments relate to a memory controller.

In some example embodiments, the memory controller includes a processor.

In some example embodiments, the processor is configured to encode a message during a write operation and decode the message during a read operation.

In some example embodiments, the processor is configured to encode the message during the write operation by generating a first code word based on the message and a write cyclic redundancy check (CRC) parity code such that a size of the write CRC parity code varies, generating a second code word such that the second code word includes the message, the write CRC parity code and an error correction code (ECC), and storing the second code word in a non-volatile memory device.

In some example embodiments, the processor is configured to decode the message during the read operation by, reading the second code word from the non-volatile memory device, iteratively decoding the second code word using the error correction code (ECC) until the second code word passes a CRC check or a number of times the iteratively decoding is performed reaches a threshold, and output the decoded message, if the second code word passes the CRC check.

In some example embodiments, the processor is configured to determine if the second code word passes the CRC check by determining if the write CRC parity code included therein equals a read CRC parity code generated based on the decoded message.

In some example embodiments, the processor is configured to iteratively decode the second code word such that, during an initial decoding operation, the second code word is determined without determining if the second code word passes the CRC check.

In some example embodiments, the size of the CRC parity code varies such that as the size of the CRC parity code increases a reliability of the error checking increases.

In some example embodiments, the processor is configured to determine a data transfer error rate due to an external condition and set the size of the CRC parity code based on the determined data transfer error rate.

In some example embodiments, the processor is configured to vary the size of the CRC parity code by selecting one of a plurality of polynomials based on enable information and applying the message to the selected polynomial to generate the first code word.

BRIEF DESCRIPTION OF THE FIGURES

Some example embodiments of the inventive concepts are illustrated in the accompanying drawings. These example embodiments are presented as examples and are not limiting of the example embodiments.

FIG. 3 is a diagram schematically illustrating a code word structure according to some example embodiments of the inventive concepts;

FIG. 4 is a diagram schematically illustrating a parallel generation method for generating a CRC parity, according to some example embodiment of the inventive concepts;

DETAILED DESCRIPTION

Figure 1:
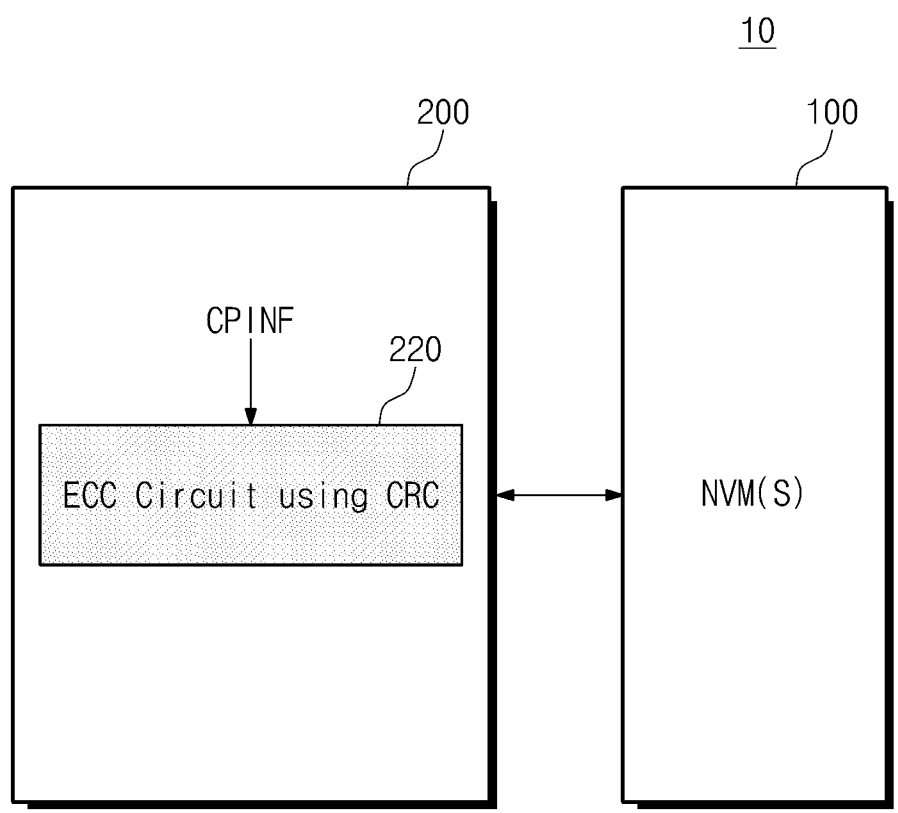
FIG. 1 is a block diagram schematically illustrating a storage device according to some example embodiments of the inventive concepts.

Example embodiments of the inventive concepts will now be described in some additional detail with reference to the accompanying drawings.

Example embodiments of the inventive concepts may, however, be embodied in many different forms and should not be construed as being limited to only the illustrated embodiments. Rather, these example embodiments are provided so that this description will be thorough and complete, and will fully convey the example embodiments of the inventive concepts to those of ordinary skill in the art. Throughout the written description and drawings, like reference numbers will be used to denote like or similar elements, steps and/or features.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

A storage device according to some example embodiments of the inventive concepts may improve data reliability by changing the size of CRC (cyclic redundancy check) parity if necessary or skipping CRC checking at an initial ECC decoding operation.

FIG. 1 is a block diagram schematically illustrating a storage device 10 according to some example embodiments of the inventive concepts.

Referring to FIG. 1, a storage device 10 includes at least one nonvolatile memory device 100 and a memory controller 200 controlling the at least one nonvolatile memory device 100.

The nonvolatile memory device 100 may be a NAND flash memory, a vertical NAND flash memory (VNAND), a NOR flash memory, a resistive RAM (RRAM), a phase-change RAM (PRAM), a magnetoresistive RAM (MRAM), an STT-RAM (Spin Transfer Torque Random Access Memory), etc. Also, the nonvolatile memory device may have a three-dimensional array structure. Example embodiments of the inventive concepts are applicable to not only a flash memory device where a charge storage layer is formed of a floating gate, but also to a charge trap flash (CTF) memory where a charge storage layer is formed of an insulation film.

The memory controller 200 controls the nonvolatile memory device 100. The memory controller 200 may include a processor and a memory (not shown).

The processor may be an arithmetic logic unit, a digital signal processor, a microcomputer, a field programmable array, a programmable logic unit, a microprocessor or any other device capable of responding to and executing instructions in a defined manner such that the processor is programmed with instructions that configure the memory controller 200 as a special purpose computer configured to perform the operations illustrated in FIGS. 8 to 11.

The instructions to configure the processor may be stored on in the memory. The memory may be a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The memory controller 200 may include an Error Correction Code (ECC) circuit 220. For example, the processor of the memory controller 200 may be programmed with instructions that configure the processor as the ECC circuit 220.

The ECC circuit 220 may generate an error correction code (ECC) corresponding to input data during a write operation and may correct an error of read data using the ECC during a read operation. The ECC generated by the ECC circuit 220 may be a hamming code, a BCH (Bose-Chauduhuri-Hocquenghen) code, a RS (Reed-Solomon) code, a Viterbi code, a turbo code, an LDPC (low density parity check), etc.

Also, the ECC circuit 220 may use cyclic redundancy check (CRC) as a stopping criterion of error correction or as an error detection means.

In some example embodiments, the size of CRC parity about input data is variable.

In some example embodiments, the ECC circuit 220 may generate the CRC parity based on CRC parity information CPINF. The CRC parity information CPINF may include information about the size of CRC parity or about a method of generating CRC parity.

In some example embodiments, the CRC parity is generated from one of a plurality of CRC parity generators that generates CRC parities with different sizes based on the CRC parity information CPINF.

In other example embodiments, the CRC parity is generated by a concatenation manner based on the CRC parity information CPINF. For example, the CRC parity is generated by generating a second CRC parity corresponding to a first CRC parity and the input data after the first CRC parity corresponding to the input data is generated. Therefore, the CRC parity may include the first CRC parity and the second CRC parity.

Also, the ECC circuit 220 may be configured not to perform a CRC error detection operation at an initial decoding operation about an iteration code (e.g., LDPC, Turbo, and the like) during a read operation. Since an error correction capacity is low at the initial decoding operation about the iteration code, the probability that an error occurs is high; hence, UEP (undetected error probability) is high. During the initial decoding operation, the ECC circuit 220 skips the CRC error detection operation to lower the UEP.

The storage device 10 may change the size of CRC parity to increase an error detection capacity and/or skip the CRC error detection operation at the initial decoding operation of the iteration code to decrease the UEP. Thus, reliability of data stored in the nonvolatile memory device 10 may be improved.

Figure 2:
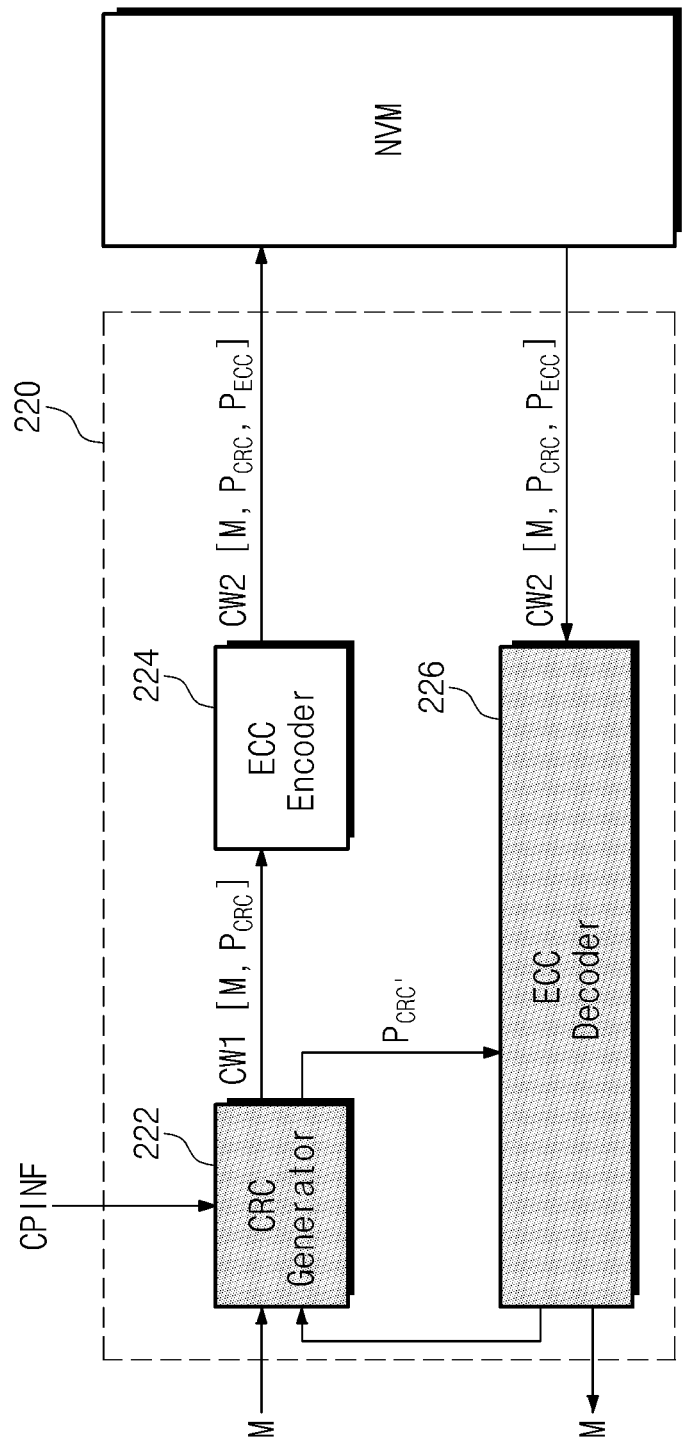
FIG. 2 is a block diagram schematically illustrating an ECC circuit according to some example embodiment of the inventive concepts.

FIG. 2 is a block diagram schematically illustrating an ECC circuit 220 according to some example embodiments of the inventive concepts.

Referring to FIG. 2, the ECC circuit 220 may include a CRC generator 222, an ECC encoder 224, and an ECC decoder 226.

The CRC generator 222 may receive data M (e.g. a message) to generate a first code word CW1. The CRC generator 222 may generate the first code word CW1 such that the first code word CW1 is formed of the data M and a CRC parity $P_{CRC}$ (or, referred to as a first parity).

In some example embodiments, the CRC generator 222 may generate the CRC parity $P_{CRC}$ by a parallel generation method or a serial generation method. The parallel generation method may generate the CRC parity $P_{CRC}$ by selecting one of a plurality of CRC parity generation polynomials that generate CRC parities with different sizes.

Further, the ECC circuit 220 may utilize the CRC generator 222 and the ECC encoder 224 such that CRC parity $P_{CRC}$ generated, using the serial generation method, may include at least two CRC parities where at least one of the CRC parities are generated using a concatenation manner. The ECC encoder 224 receives the first code word CW1 and generates a second code word CW2 using an error correction code (ECC). The ECC encoder 224 may generate the second code word CW2 such that the second code word CW2 is formed of data M, the CRC parity $P_{CRC}$, and the ECC parity $P_{ECC}$ (or, referred to as a second parity). The error correction code (ECC) may be an iteration code (e.g., Turbo, LDPC, or the like). The second code word CW2 may be stored in a nonvolatile memory device NVM during a write operation and may be read from the nonvolatile memory device NVM during a read operation. In some example embodiments, when the nonvolatile memory device NVM is a NAND flash memory device, the size of the second code word CW2 corresponds to a page.

The ECC decoder 226 may iteratively perform a decoding operation in which an error of the second code word CW2 is corrected using an error correction code. The ECC decoder 226 determines whether to end a decoding operation, based on the CRC parity $P_{CRC}$. During an initial decoding operation, the ECC decoder 226 may not perform an error detection operation using the CRC parity $P_{CRC}$. If no error is detected during the error detection operation using the CRC parity $P_{CRC}$, the ECC decoder 226 outputs the data M.

The ECC circuit 220 according to some example embodiments of the inventive concepts generates the CRC parity $P_{CRC}$ by various methods and does not perform an error detection operation using the CRC parity $P_{CRC}$ during an initial ECC decoding operation.

FIG. 3 is a diagram schematically illustrating a code word structure according to some example embodiments of the inventive concepts.

Referring to FIGS. 1 to 3, a code word may include user data, a CRC parity $P_{CRC}$, and an ECC parity $P_{ECC}$. The code word may be exchanged between the nonvolatile memory device and the memory controller 200 such that the code word varies according to the size of the CRC parity $P_{CRC}$.

In some example embodiments, the size of the CRC parity $P_{CRC}$ is selected by a user of the storage device 10. For example, the user may decide the size of the CRC parity $P_{CRC}$ using firmware that controls the storage device 10. The user may decide the size of the CRC parity $P_{CRC}$ based on required reliability of the storage device 10.

In other example embodiments, the size of the CRC parity $P_{CRC}$ is selected according to a request of a host that uses the storage device 10. The host decides a degree of reliability of the storage device 10 and decides the size of the CRC parity $P_{CRC}$ to be suitable to the reliability thus decided.

In still other example embodiments, the size of the CRC parity $P_{CRC}$ may be selected by a hardware device included in the storage device 10. A user of the storage device 10 optionally may instruct the hardware device to decide the size of the CRC parity $P_{CRC}$.

In still other example embodiments, the storage device 10 may automatically decide the size of the CRC parity $P_{CRC}$ according to an internal process. For example, the storage device 10 may predict a product lifecycle of a volatile memory device 100 and decide the size of the CRC parity $P_{CRC}$ according to the prediction result. Also, the storage device 10 may determine the probability of error of data due to an external condition (e.g., a temperature, noise, or the like) when a write or read operation is performed. The storage device 10 may decide the size of the CRC parity $P_{CRC}$ according to the determination result.

The code word may include the CRC parity $P_{CRC}$ with the size which is variable according to selection of a user, a request of a host, or a peripheral environment.

FIG. 4 is a diagram schematically illustrating a parallel generation method for generating a CRC parity, according to some example embodiments of the inventive concepts.

Referring to FIGS. 2 and 4, the CRC generator 222 may generate CRC parities $P_{CRC1}$ to $P_{CRCi}$ (i being an integer of 2 or more) with different sizes. For example, the CRC parity $P_{CRC}$ with a relatively large size may be generated to increase an error detection capacity.

Figure 5:
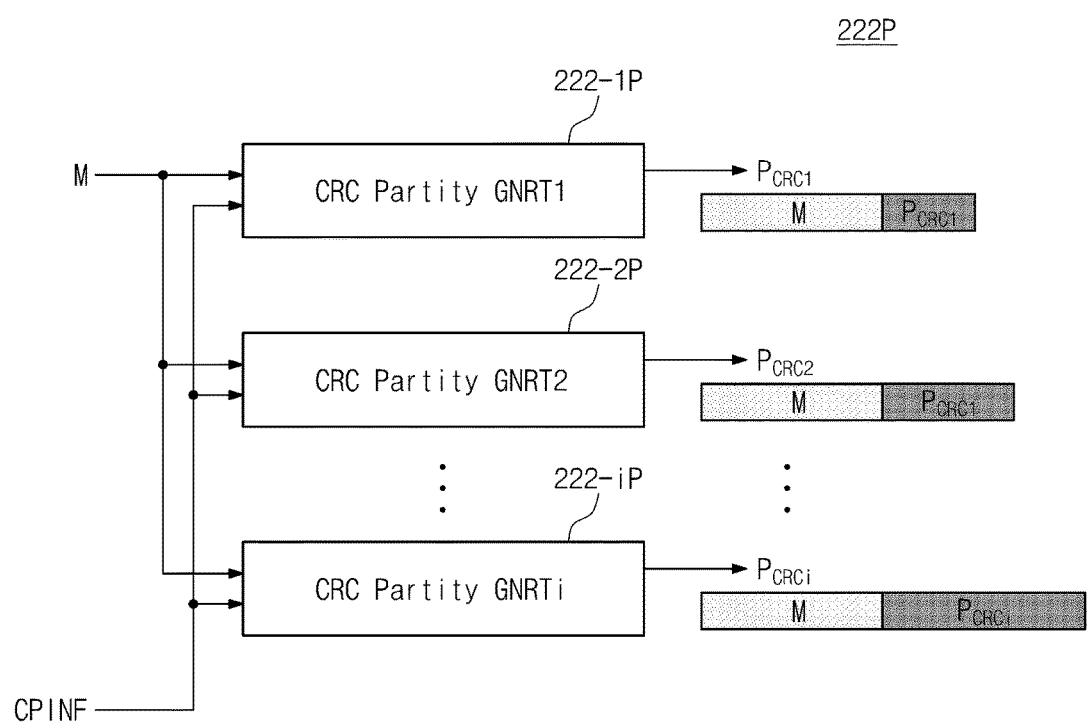
FIG. 5 is a diagram schematically illustrating a CRC generator using a CRC parity generating method shown in FIG. 4.

FIG. 5 is a diagram schematically illustrating a CRC generator 222P using a CRC parity generating method shown in FIG. 4.

The CRC generator 222P may include a plurality of CRC parity generators 222-1P to 222-iP.

The CRC parity generators 222-1P to 222-iP may be implemented by different generator polynomials. Also, the CRC parity generators 222-1P to 222-iP may generate CRC parities with different sizes.

One of the CRC parity generators 222-1P to 222-iP may be enabled based on CRC parity enable information CENINF. The enabled CRC parity generator 222-1P to 222-iP may receive data M to generate a CRC parity $P_{CRC}$. For example, when a first CRC parity generator 222-1P is enabled, a first code word CW1 is formed of the data M and a first CRC parity $P_{CRC1}$. When a second CRC parity generator 222-2P is enabled, the first code word CW1 is formed of the data M and a second CRC parity $P_{CRC2}$.

In some example embodiments, the CRC parity enable information CENINF is generated inside or outside of the storage device 10 according to selection of a user, a request of a host, internal needs, etc.

The CRC generator 222P according to some example embodiment of the inventive concepts may generate a required CRC parity by enabling a CRC parity generator that is selected based on the CRC parity enable information CENINF.

Figure 6:
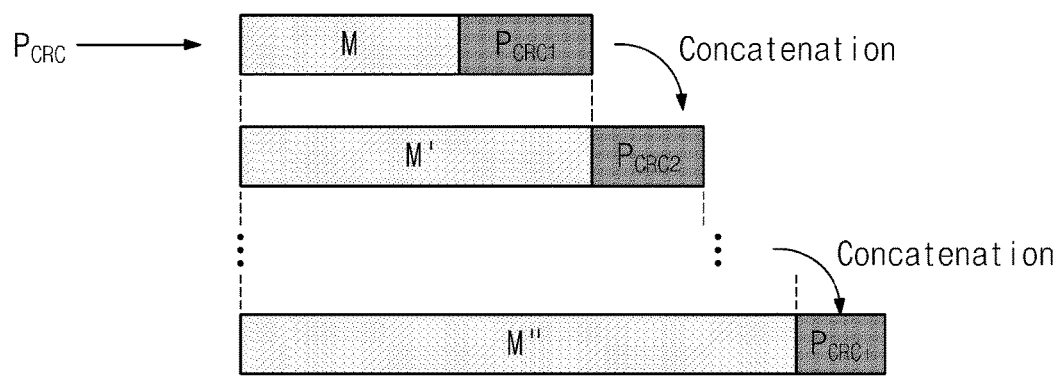
FIG. 6 is a diagram schematically illustrating a serial generation method for generating a CRC parity according to some example embodiments of the inventive concepts.

FIG. 6 is a diagram schematically illustrating a serial generation method for generating a CRC parity according to an embodiment of the inventive concept.

Referring to FIG. 6, the CRC generator 222 may generate CRC parities $P_{CRC1}$ to $P_{CRCj}$ (j being an integer of 2 or more) using a concatenation method. For example, a second CRC parity $P_{CRC2}$ may be generated using data M and a first CRC parity $P_{CRC1}$ previously generated as new data M'. The last CRC parity $P_{CRCj}$ is generated according to the above-described concatenation manner.

Figure 7:
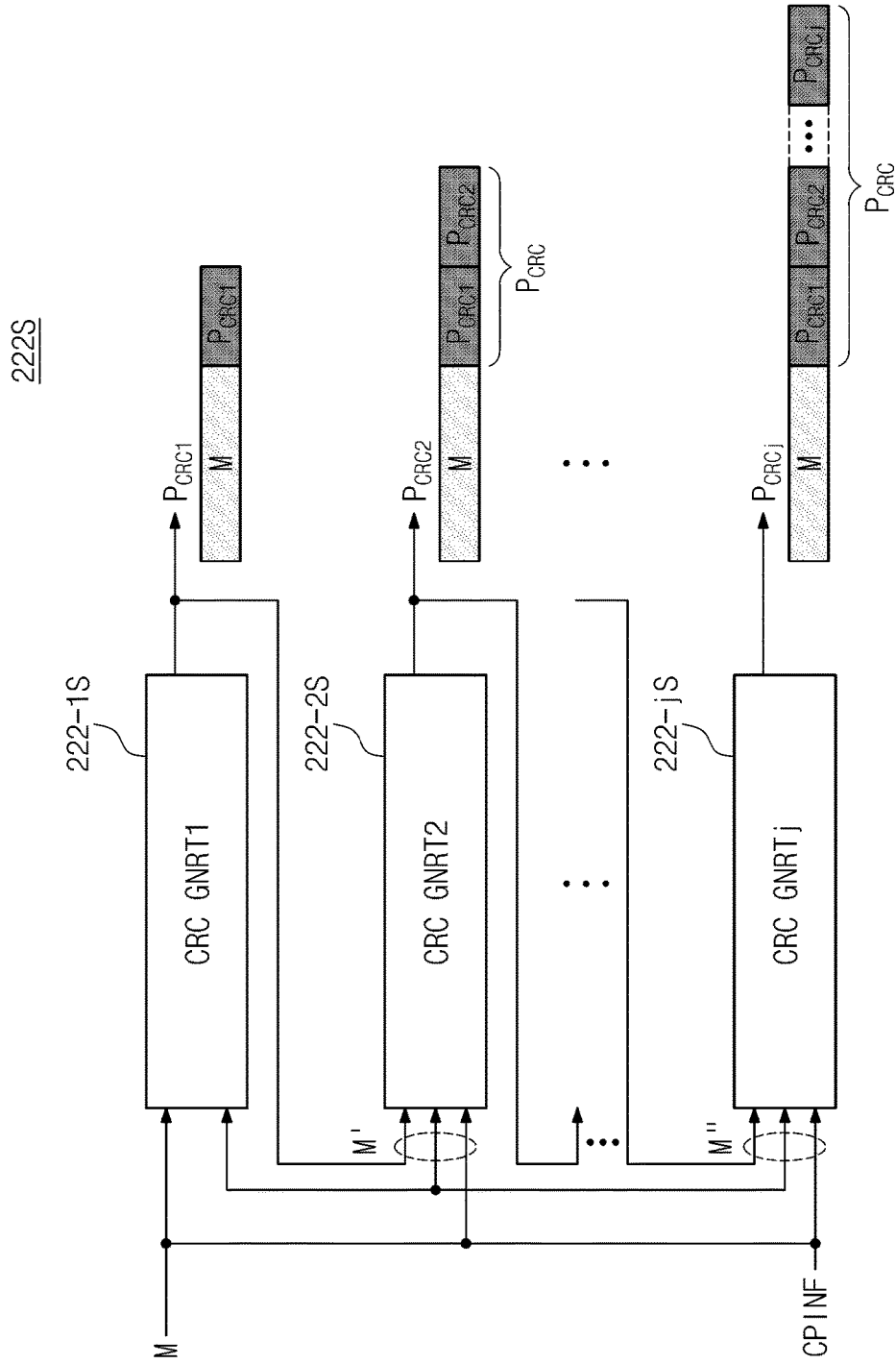
FIG. 7 is a diagram schematically illustrating a CRC generator using a method of generating a CRC parity in a concatenation manner shown in FIG. 6.

FIG. 7 is a diagram schematically illustrating a CRC generator 222S using a method of generating a CRC parity in a concatenation manner shown in FIG. 6.

Referring to FIG. 7, a CRC generator 222S includes a plurality of CRC parity generators 222-1S to 222-jS (j being an integer of 2 or more).

The CRC parity generators 222-1S to 222-jS may be implemented by different generator polynomials. Also, the CRC parity generators 222-1S to 222-jS may generate CRC parities with different sizes and sizes of the generated CRC parities are not limited to the examples illustrated herein.

At least two of the CRC parity generators 222-1S to 222-jS are enabled to generate a CRC parity $P_{CRC}$ according to the concatenation manner. The CRC parity enable information CENINF includes information about the enabled parity generators of the CRC parity generators 222-1S to 222-jS.

In some example embodiments, the CRC parity enable information CENINF includes information that is used to generate a first CRC parity $P_{CRC1}$ that is associated with input data M without using concatenation. The data M and the first CRC parity $P_{CRC1}$ may form a code word M'.

The first CRC generator 222-1S may provide the generated code word M' to the second CRC generator 222-2S. The second CRC generator 222-2S may generate a code word M'' using the data M and a CRC parity $P_{CRC}$ where the CRC parity $P_{CRC}$ is formed of a first CRC parity $P_{CRC1}$ and a second CRC parity $P_{CRC2}$. In detail, the first CRC generator 222-1S receives data M to generate the first CRC parity $P_{CRC1}$, and the second CRC generator 222-2S receives data M' to generate the second CRC parity $P_{CRC2}$. In other words, the CRC generator 222S is configured such that a new code word is generated using a previously generated code word.

The CRC generator 222S according to some example embodiments of the inventive concepts may generate a required CRC parity by sequentially enabling CRC parity generators based on the CRC parity enable information CENINF.

Figure 8:
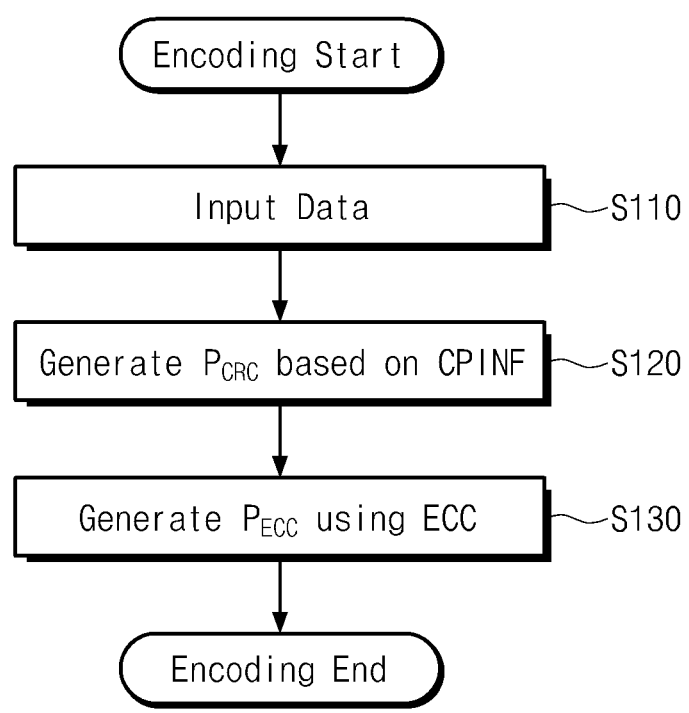
FIG. 8 is a flow chart schematically illustrating an encoding method of an ECC circuit, according to some example embodiment of the inventive concepts.

FIG. 8 is a flow chart schematically illustrating an encoding method of an ECC circuit 220, according to an embodiment of the inventive concept.

Referring to FIGS. 1 to 8, in operation S110, data may be provided to the ECC circuit 220 during a write operation. In operation S120, the ECC circuit 220 may generate a CRC parity $P_{CRC}$ corresponding to the input data based on CRC parity information CPINF. As illustrated in FIGS. 4 and 5, the CRC parity $P_{CRC}$ may be generated according to a parallel generation method using at least one CRC polynomial selected by the CRC parity information CPINF. Alternatively, as illustrated in FIGS. 6 and 7, the CRC parity $P_{CRC}$ may be generated according to a serial generation method that includes concatenation.

In operation S130, the ECC circuit 220 generates an ECC parity $P_{ECC}$ about the input data using an error correction code (ECC). Here, the error correction code ECC may be an iteration code.

As discussed above, the data encoding method according to some example embodiments of the inventive concepts may generate a CRC parity based on the CRC parity information CPINF and one of a plurality of CRC polynomials. Further, the data encoding method according to other example embodiments of the inventive concepts may generate a plurality of CRC parities in a concatenation manner based on CRC parity information CPINF and a plurality of CRC polynomials.

Figure 9:
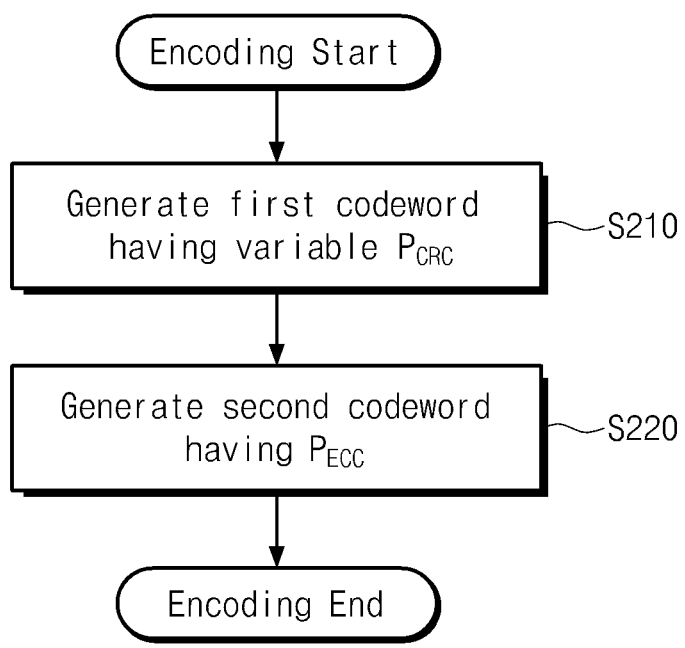
FIG. 9 is a flow chart schematically illustrating an encoding method of an ECC circuit, according to other example embodiments of the inventive concepts.

FIG. 9 is a flow chart schematically illustrating an encoding method of an ECC circuit 220, according to other example embodiments of the inventive concepts.

Referring to FIGS. 1 to 7 and 9, data may be provided to the ECC circuit 220 during a write operation. In operation S210, the ECC circuit 220 generates a first code word CW1 with a variable CRC parity $P_{CRC}$ corresponding to the input data based on CRC parity information CPINF. The first code word CW1 is formed of data and a CRC parity $P_{CRC}$.

In operation S220, the ECC circuit 220 receives the first code word CW1 and generates a second code word CW2 with an ECC parity $P_{ECC}$ about the input data using an error correction code (ECC). The second code word CW2 is formed of the data, the CRC parity $P_{CRC}$, and the ECC parity $P_{ECC}$.

Therefore, the data encoding method according to some example embodiments of the inventive concepts may generate a variable CRC parity $P_{CRC}$ based on the CRC parity information CPINF.

Figure 10:
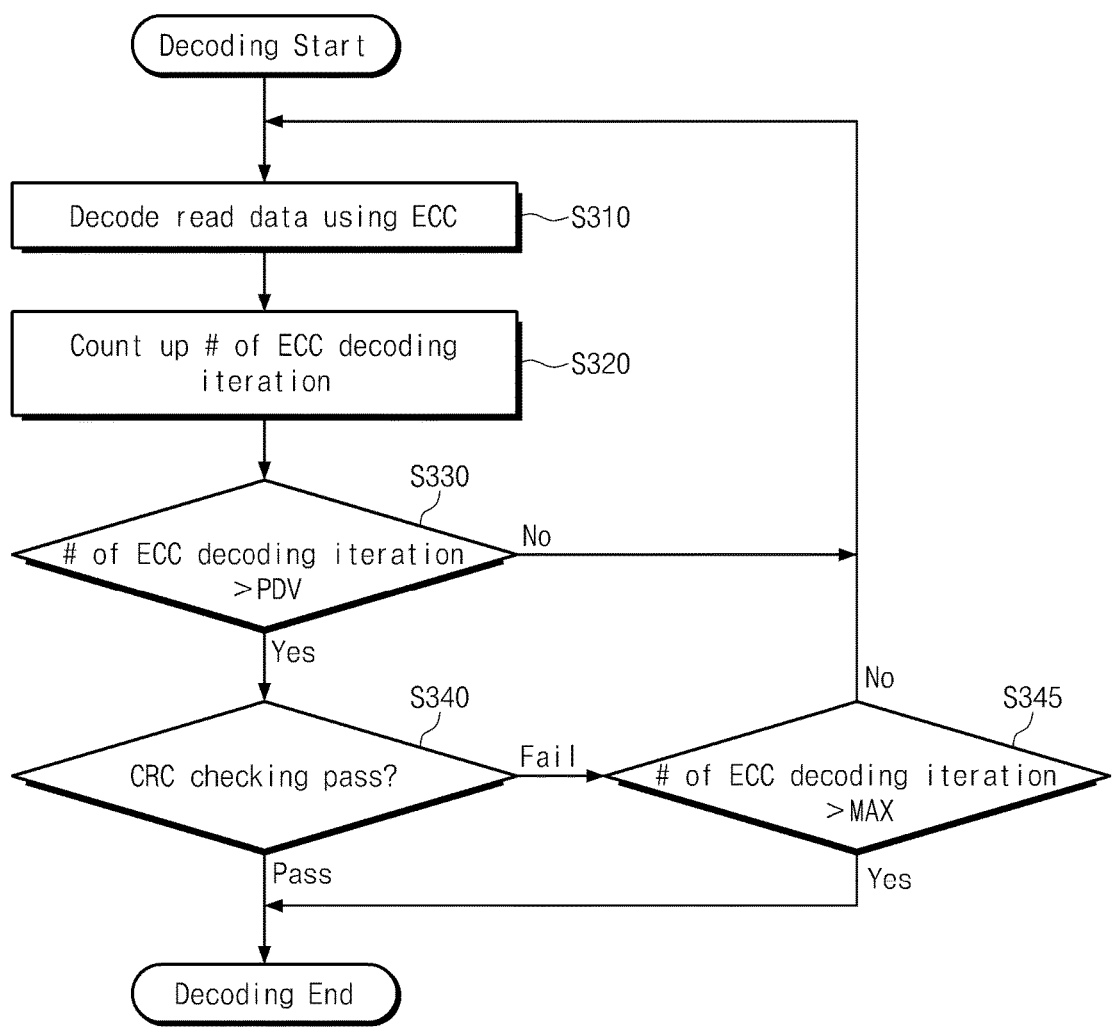
FIG. 10 is a flow chart schematically illustrating a decoding method of an ECC circuit according to some example embodiments of the inventive concepts.

FIG. 10 is a flow chart schematically illustrating a decoding method of an ECC circuit 220 according to some example embodiments of the inventive concepts.

Referring to FIGS. 1 to 10, the memory controller 200 may read data from the nonvolatile memory device 100 during a read operation. The read data may include data M, a CRC parity $P_{CRC}$, and an ECC parity $P_{ECC}$.

In operation S310, the ECC circuit 220 performs a decoding operation about the read data using an error correction code (ECC). The error correction code (ECC) may be an iteration code. After the decoding operation, in operation S320, the ECC circuit 220 may increment a counter associated with the number of decoding operations.

In operation S330, the ECC circuit 220 may determine whether the number of decoding operations iterated exceeds a desired (or, alternatively, a predetermined) value PDV. If the number of decoding operations iterated does not exceed the value PDV, the ECC circuit 220 continues to iteratively repeat operations S310 to S330. In contrast, if the number of decoding operations iterated exceeds the value PDV, in operation S340, the ECC circuit 220 performs a CRC check. The ECC circuit 220 may perform the CRC check by determining if a CRC parity $P_{CRC}$ of the read data is equal to a CRC parity corresponding to error-corrected data.

If the CRC checking fails, in operation S345, the ECC circuit 200 determines if whether the number of decoding operations iterated exceeds a maximum value MAX. If the number of decoding operations iterated does not exceed the maximum value MAX, the ECC circuit 220 proceeds to operation S310 to iterate the decoding operation. In contrast, if the number of decoding operations iterated exceeds the maximum value MAX, the ECC circuit 220 determines that the error correction has failed and ends the decoding operation.

If the CRC checking passes, the ECC circuit 220 outputs error-corrected data as output data and ends the decoding operation.

The decoding operation of the ECC circuit 220 according to some example embodiments of the inventive concepts may skip CRC checking when the number of decoding operations iterated exceeds the value PDV.

In contrast, CRC checking may be performed when the number of decoding operations iterated does not exceed the value PDV.

Figure 11:
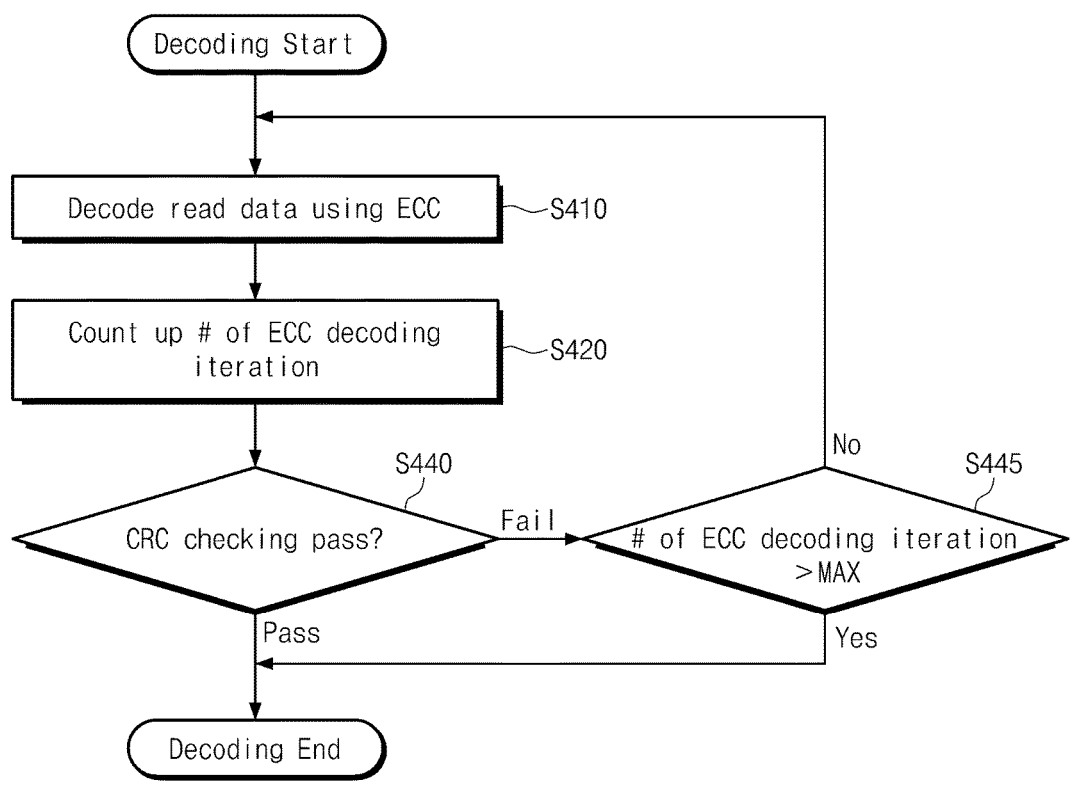
FIG. 11 is a flow chart schematically illustrating a decoding method of an ECC circuit according to other example embodiments of the inventive concepts.

FIG. 11 is a flow chart schematically illustrating a decoding method of an ECC circuit 220 according to other example embodiments of the inventive concepts.

Referring to FIGS. 10 and 11, a decoding method of the ECC circuit 220 shown in FIG. 11 is substantially the same as that shown in FIG. 10 except for operation S330. Therefore, for the sake of brevity, repeated description will be omitted.

In operation S410, the ECC circuit 220 of the memory controller 200 performs a decoding operation about read data using an error correction code (ECC). In operation S420, after the decoding operation, the ECC circuit 220 may increment a counter associated with the number of decoding operations. In operation S440, the ECC circuit 220 may perform a CRC check. If the CRC checking is passed, in operation S445, the ECC circuit 220 may determine whether or not the number of decoding operations iterated exceeds a maximum value MAX. If the number of decoding operations iterated does not exceed the maximum value MAX, the ECC circuit 220 proceeds to operation S410 to iterate the decoding. If the number of decoding operations iterated exceeds the maximum value MAX, the ECC circuit 220 determines that the error correction has failed and ends the decoding operation.

If the CRC checking is passed, the ECC circuit 220 outputs error-corrected data as output data and ends the decoding operation.

The ECC circuit 220 may perform CRC checking whenever the decoding operation is performed.

Figure 12:
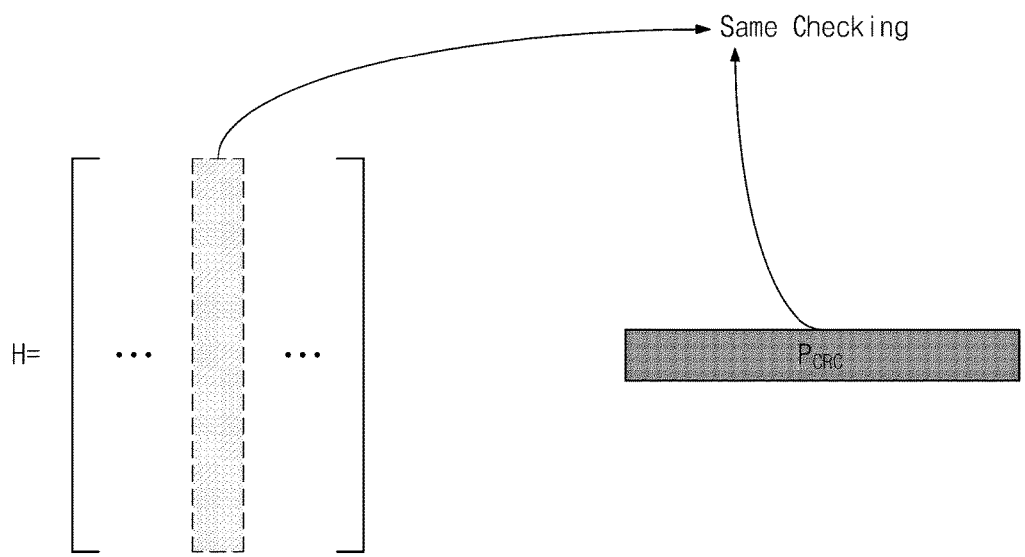
FIG. 12 is a diagram for describing CRC checking according to some example embodiments of the inventive concepts.

FIG. 12 is a diagram for describing CRC checking according to some example embodiments of the inventive concepts.

Referring to FIG. 12, "H" indicates a matrix for a decoding operation of an ECC circuit 220. The ECC circuit 200 may perform the CRC checking to determine whether a column (or, a row) of the matrix H is the same as read CRC parity $P_{CRC}$.

The storage device 10 according to some example embodiments of the inventive concepts may be implemented to use at least two different error correction codes.

Figure 13:
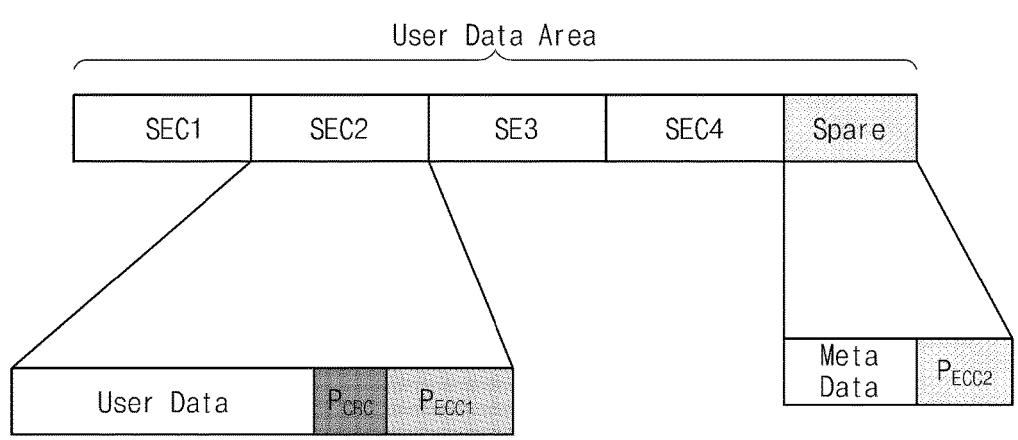
FIG. 13 is a diagram schematically illustrating a data structure according to some example embodiments of the inventive concepts.

FIG. 13 is a diagram schematically illustrating a data structure according to some example embodiments of the inventive concepts.

Referring to FIGS. 1 and 13, page data exchanged between the nonvolatile memory device 100 and the memory controller 200 may consist of user data and spare areas formed of a plurality of sectors.

Each sector includes user data, a CRC parity $P_{CRC}$, and a first parity $P_{ECC1}$. The CRC parity $P_{CRC}$ may be generated as described with reference to FIGS. 1 to 12. Also, the first parity $P_{ECC1}$ may be generated to correspond to user data using a first error correction code (ECC).

The spare area consists of metadata for managing page data and a second parity $P_{ECC2}$ for correcting an error of the metadata. Here, the second parity $P_{ECC2}$ is generated to correspond to the metadata using a second error correction code (ECC).

In some example embodiments, the first error correction code (ECC) may be different from the second error correction code (ECC). For example, the first error correction code may be an LDPC code, and the second error correction code may be a BCH code. The LDPC code is in detail disclosed in U.S. Patent Publication No. 2013-0173985, the entire contents of which are hereby incorporated by reference.

The storage device 10 may randomize data and perform error correction about randomized data.

Figure 14:
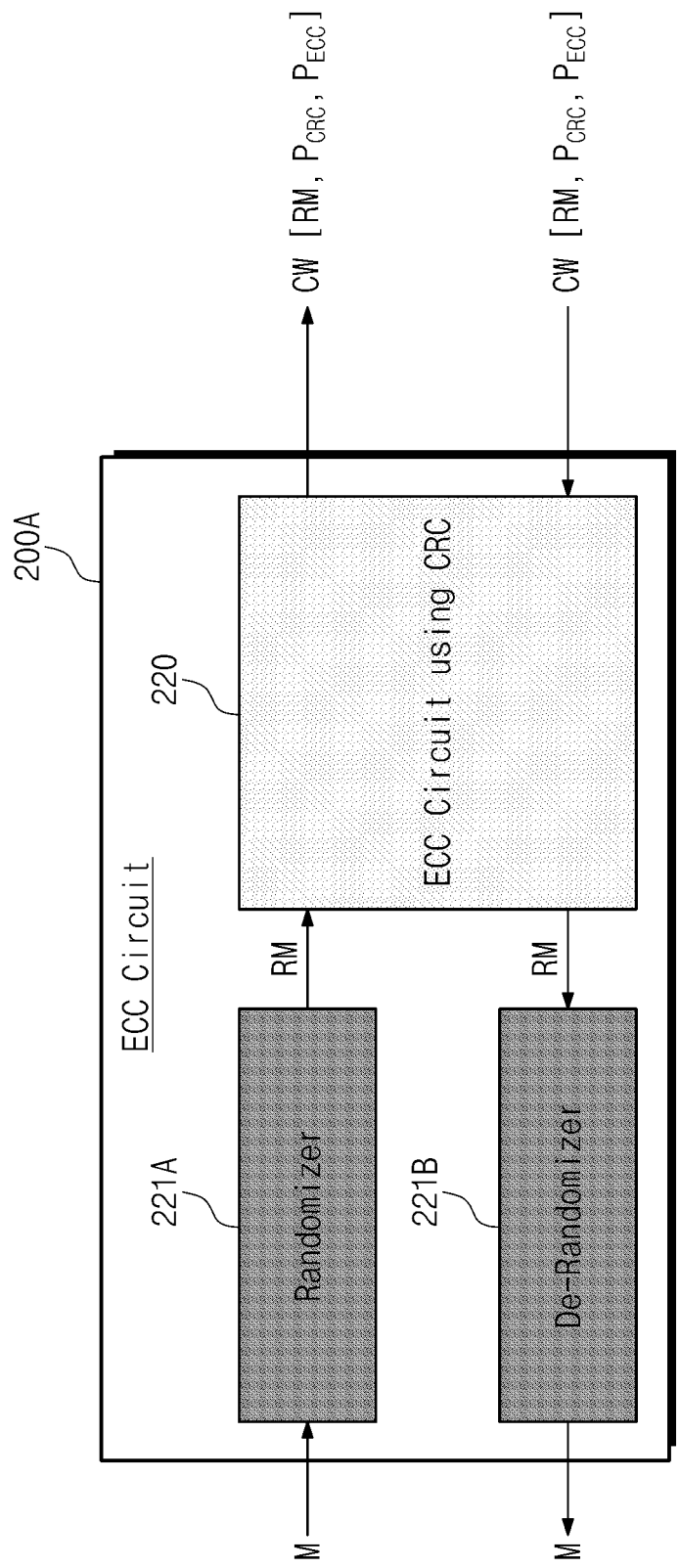
FIG. 14 is a block diagram schematically illustrating an ECC circuit according to other example embodiments of the inventive concepts.

FIG. 14 is a block diagram schematically illustrating an ECC circuit 220A according to other example embodiments of the inventive concepts.

Referring to FIG. 14, an ECC circuit 220A includes a randomizer 221A, a de-randomizer 221B, and an ECC circuit 220 using CRC, The ECC circuit 220 may be implemented as the ECC circuit 220 illustrated in FIG. 1.

The randomizer 221A receives data M to output randomized data RM. The ECC circuit 220 receives the randomized data RM and generates codeword CW. The codeword CW generated by the ECC circuit 200 may include the randomized data RM, a CRC parity $P_{CRC}$ and an ECC parity $P_{ECC}$.

The de-randomizer 221B receives error-corrected randomized data RM output from the ECC circuit 220 to output de-randomized data, that is, original data M.

Figure 15:
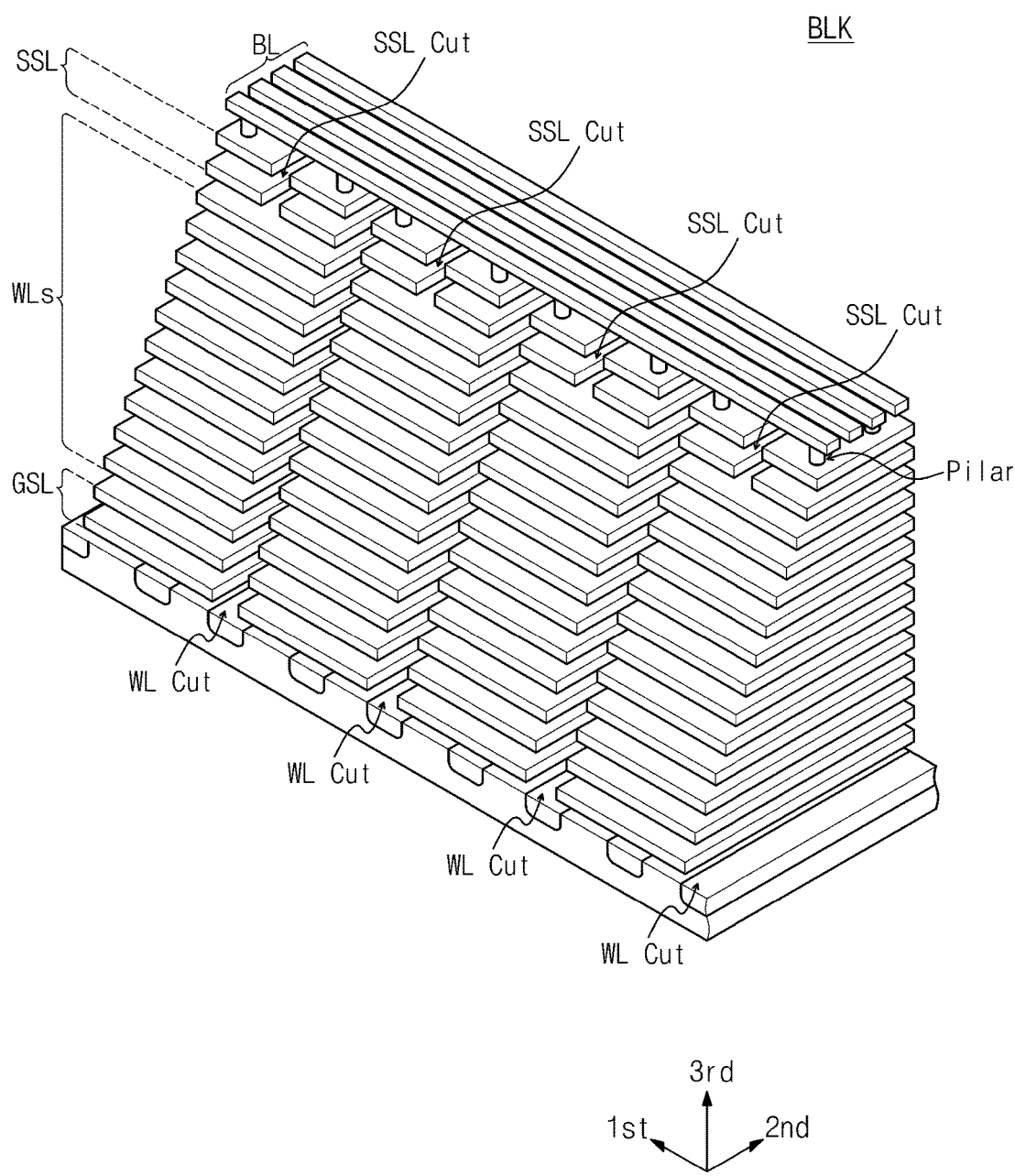
FIG. 15 is a perspective view of a VNAND block according to some example embodiments of the inventive concepts.

In the example embodiment illustrated in FIG. 15, the randomizer 221A and the de-randomizer 221B are disposed at a front stage of the ECC circuit 220, however, example embodiments of the inventive concepts are not limited thereto. For example, the randomizer 221A and the de-randomizer 221B may be disposed at a rear stage of the ECC circuit 220.

The ECC circuit 220A according to some example embodiments of the inventive concepts is configured to randomize data and to de-randomize randomized data.

Example embodiments of the inventive concepts are applicable to a VNAND (Vertical NAND flash memory).

FIG. 15 is a perspective view of a VNAND block according to some example embodiments of the inventive concepts.

Referring to FIG. 15, four sub blocks may be formed on a substrate. Each sub block may be formed by stacking at least one ground selection line GSL, a plurality of word lines, and at least one string selection line SSL on the substrate and between word line cuts in a plate shape. Here, the at least one string selection line SSL is separated by string selection line cuts.

Although not shown in FIG. 15, each word line cut may include a common source line CSL. In some example embodiments, the common source lines CSL included in the word line cuts may be interconnected. A string may be formed by making a pillar connected to a bit line penetrate the at least one string selection line SSL, the word lines, and the at least one ground selection line GSL.

In FIG. 15, there is illustrated a sub block between word line cuts. However, example embodiments of the inventive concepts are not limited thereto. For example, a structure between a word line cut and a string selection line cut may be defined as a sub block.

A memory block according to some example embodiments of the inventive concepts may be implemented to have a merged word line structure where two word lines are merged to one.

Example embodiments of the inventive concepts are also applicable to a solid state drive (SSD).

Figure 16:
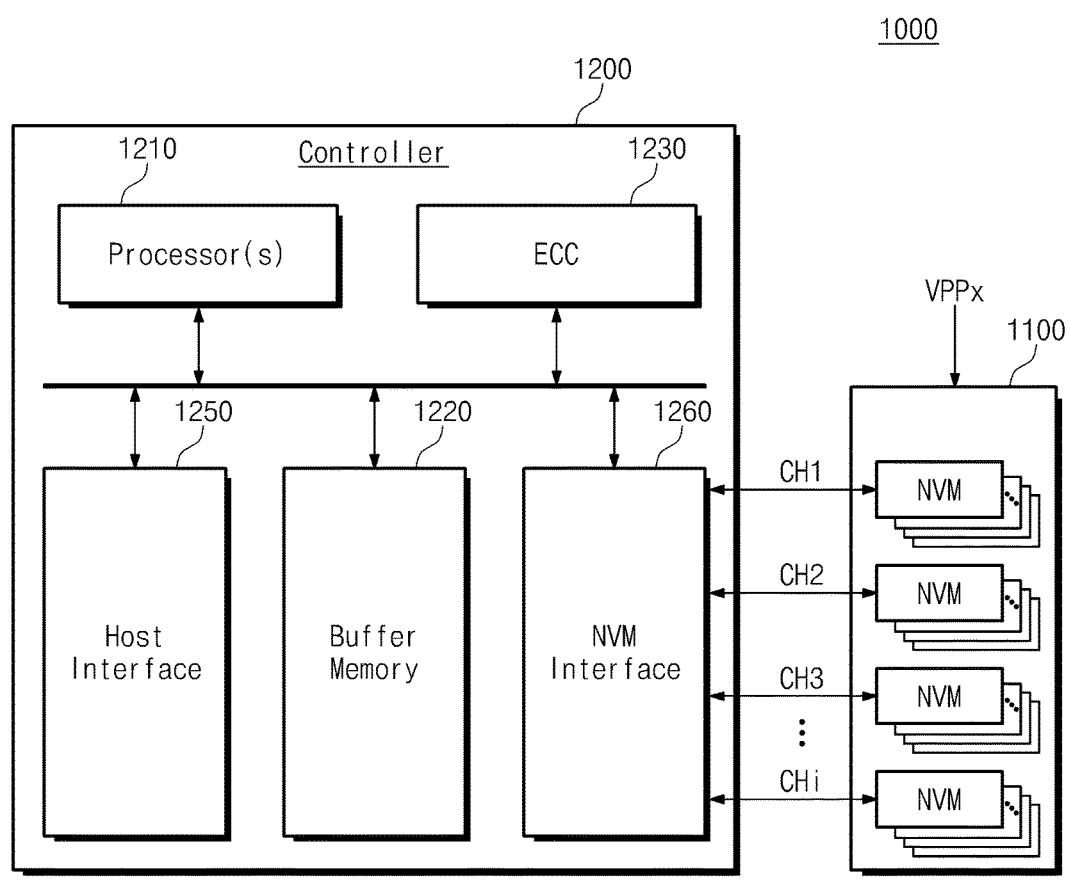
FIG. 16 is a block diagram schematically illustrating a solid state drive according to some example embodiments of the inventive concepts.

FIG. 16 is a block diagram schematically illustrating a solid state drive according to some example embodiments of the inventive concepts.

Referring to FIG. 16, a solid state drive (SSD) 1000 includes a plurality of nonvolatile memory devices 1100 and an SSD controller 1200.

The nonvolatile memory devices 1100 are implemented to be provided with an external high voltage VPPx optionally. The SSD controller 1200 is connected to the nonvolatile memory devices 1100 through a plurality of channels CH1 to CHi (i being an integer of 2 or more). The SSD controller 1200 includes one or more processors 1210, a buffer memory 1220, an ECC block 1230, a host interface 1250, and a nonvolatile memory interface 1260. The SSD controller 1200 decides whether to perform a dummy program operation about a memory block and to perform continuous writing after the dummy program operation.

The buffer memory 1220 stores data needed to drive the SSD controller 1200. The buffer memory 1220 may include a plurality of memory lines each storing data or a command. In FIG. 16, the buffer memory 1220 is included in the SSD controller 1200. However, example embodiments of the inventive concepts are not limited thereto. For example, the buffer memory 1220 may be placed outside the SSD controller 1200.

The ECC circuit 1230 may implemented with the ECC circuit 220 shown in FIG. 1 or with the ECC circuit 220A shown in FIG. 14.

Although not shown in FIG. 16, a code memory may be further included to store code data needed to drive the SSD controller 1200. The code memory may be implemented with a nonvolatile memory device.

The host interface 1250 provides an interface with an external device. The host interface 1250 may be a NAND flash interface. The nonvolatile memory interface 1260 provides an interface with the nonvolatile memory devices 1100.

In example embodiments of the inventive concepts, reliability of the SSD 1000 may be improved by varying a CRC parity $P_{CRC}$.

Example embodiments of the inventive concepts are applicable to an eMMC (e.g., an embedded multimedia card, moviNAND, iNAND, etc.).

Figure 17:
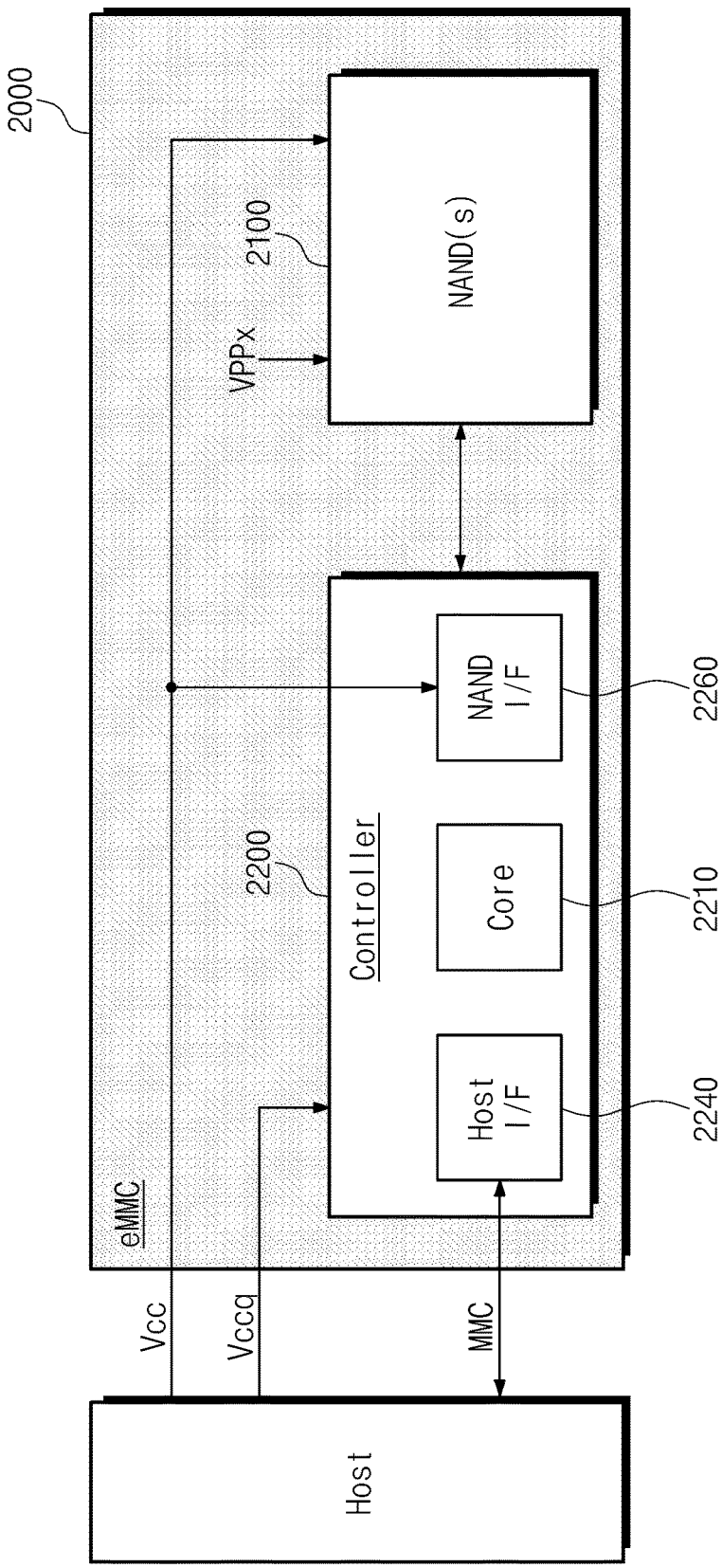
FIG. 17 is a block diagram schematically illustrating an eMMC according to some example embodiments of the inventive concepts.

FIG. 17 is a block diagram schematically illustrating an eMMC according to some example embodiments of the inventive concepts.

Referring to FIG. 17, an eMMC 2000 includes one or more NAND flash memory devices 2100 and a controller 2200.

The controller 2200 is connected to the NAND flash memory device 2100 via a plurality of channels. The controller 2200 includes one or more controller cores 2210, a host interface 2250, and a NAND interface 2260. The controller core 2210 may control an overall operation of the eMMC 2000. The host interface 2250 is configured to perform an interface between the controller 2210 and a host. The NAND interface 2260 is configured to provide an interface between the NAND flash memory device 2100 and the controller 2200. In some example embodiments, the host interface 2250 may be a parallel interface (e.g., an MMC interface). In other example embodiments, the host interface 2250 of the eMMC 2000 may be a serial interface (e.g., UHS-II, UFS, etc.).

The memory controller 2200 may perform an error correction operation using CRC as described with reference to FIGS. 1 to 14.

The eMMC 2000 receives power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In some example embodiments, the eMMC 2000 may be optionally supplied with an external high voltage.

In example embodiments, reliability and a life time of the eMMC 2000 may be improved by changing the size of CRC parity $P_{CRC}$ according to selection of a user, a request of a host, internal management information, or environment information and by skipping CRC parity checking at an initial ECC decoding operation.

Example embodiments of the inventive concepts are also applicable to universal flash storage UFS.

Figure 18:
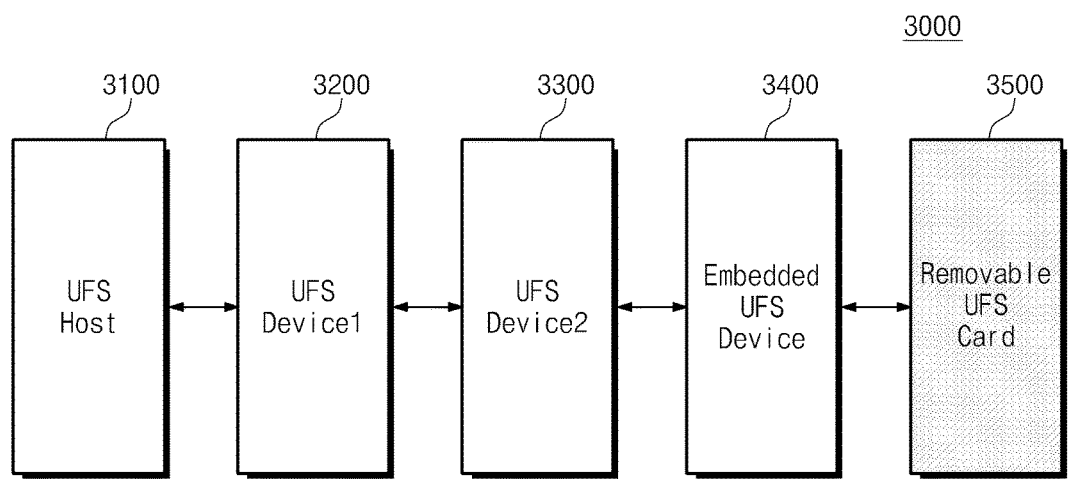
FIG. 18 is a block diagram schematically illustrating a UFS system according to some example embodiments of the inventive concepts.

FIG. 18 is a block diagram schematically illustrating a UFS system according to some example embodiments of the inventive concepts.

Referring to FIG. 18, a UFS system 3000 includes a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may be implemented with the storage device 10 shown in FIG. 1.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Example embodiments of the inventive concepts are applicable to a mobile device.

Figure 19:
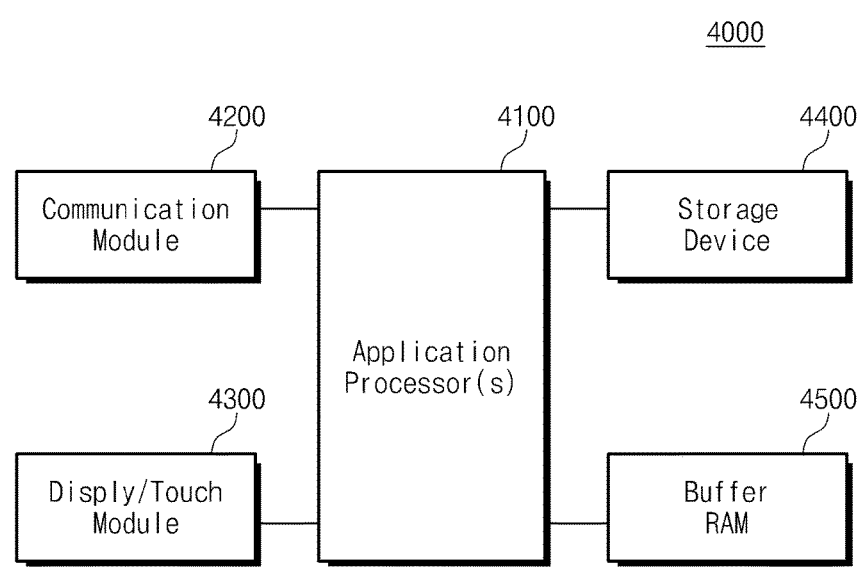
FIG. 19 is a block diagram schematically illustrating a mobile device according to some example embodiments of the inventive concepts.

FIG. 19 is a block diagram schematically illustrating a mobile device 4000 according to an embodiment of the inventive concept.

Referring to FIG. 19, a mobile device 4000 includes an application processor 4100, a communication module 4200, a display/touch module 4300, a storage device 4400, and a buffer RAM 4500.

The application processor 4100 controls an overall operation of the mobile device 4000. The communication module 4200 is implemented to perform wireless and/or wire communications with an external device. The display/touch module 4300 is implemented to display data processed by the application processor 4100 or to receive data through a touch panel. The storage device 4400 is implemented to store user data. The storage device 4400 may be implemented by the storage device 10 shown in FIG. 1. The buffer RAM 4500 is configured to temporarily store data needed for a processing operation of the mobile device 4000.

In example embodiments, reliability and a life time of the mobile device 4000 may be improved by changing the size of CRC parity $P_{CRC}$ according to a peripheral environment at an ECC encoding operation or by skipping CRC parity checking at an ECC decoding operation.

A memory system and/or a storage device according to example embodiments of the inventive concepts may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While some example embodiments of the inventive concepts have been described, it will be apparent to those skilled in the art that various changes and modifications may be made without departing from the spirit and scope thereof. Therefore, it should be understood that the above example embodiments are not limiting, but illustrative.

What is claimed is:

1. A storage device comprising:
   at least one nonvolatile memory device configured to store data; and
   a memory controller configured to control the at least one nonvolatile memory device, the memory controller including an error correction code (ECC) circuit, the ECC circuit, including
      a first CRC generator configured to
         receive the data from a host, and
         generate a first cyclic redundancy check (CRC) parity corresponding to the data at a write operation,
      a second CRC generator configured to
         receive the data and the first CRC parity, and
         generate a second CRC parity corresponding to the data and the first CRC parity at the write operation, wherein a size of the second CRC parity is different from a size of the first CRC parity, and the size of the first CRC parity and the size of the second CRC parity are selected according to a request of the host,
      an ECC encoder configured to generate an error correction code (ECC) parity corresponding to the data, the first CRC parity, and the second CRC parity using an error correction code (ECC) at the write operation, wherein the data, the first CRC parity, the second CRC parity, and the ECC parity are stored in the at least one nonvolatile memory device at the write operation, and
      an ECC decoder configured to
         perform a decoding operation correcting an error of the data from the at least one nonvolatile memory device using the ECC parity at a read operation,
         generate corrected data by iteratively performing the decoding operation and increasing a number of iterations of the decoding operation, and
         perform a CRC checking operation on the corrected data using the first CRC parity and the second CRC parity if the number of iterations of the decoding operation exceeds a value such that the ECC circuit is configured to skip the CRC checking operation during an initial decoding operation, wherein the ECC circuit is further configured to send the corrected data to the host via a host interface if no error is detected during the CRC checking operation and the CRC checking operation passes.

2. The storage device of claim 1, wherein the data is randomized data.

3. The storage device of claim 2, wherein the memory controller is further configured to, randomize the data received from the host at the write operation and de-randomize the corrected data at the read operation and output the data.

4. The storage device of claim 1, wherein the ECC circuit further comprises:

a third CRC generator configured to receive the data, the first CRC parity, and the second CRC parity, and generate a third CRC parity corresponding to the data, the first CRC parity, and the second CRC parity at the write operation.

5. The storage device of claim 1, wherein if the number of iterations of the decoding operation is less than the value, the ECC decoder is further configured to skip the CRC checking operation.

6. The storage device of claim 1, wherein the ECC is an iteration code.

7. The storage device of claim 6, wherein the iteration code is a low density parity check (LDPC) code.

8. A memory controller comprising:

a processor configured to, encode a message during a write operation by, generating a first code word based on the message and a first cyclic redundancy check (CRC) parity, generating a second code word based on the message, the first CRC parity, and a second CRC parity, wherein a size of the second CRC parity is different from a size of the first CRC parity, and the size of the first CRC parity and the size of the second CRC parity are selected according to a request of a host, generating a third code word including the second code word and an error correction code (ECC) parity, and storing the third code word in a non-volatile memory device; and decode the message during a read operation by, reading the third code word from the non-volatile memory device, iteratively decoding the third code word by performing a decoding operation using the ECC parity to generate a decoded message, performing a CRC checking operation on the decoded message using the first CRC parity and the second CRC parity if a number of iterations of the decoding operation exceeds a value such that the processor is configured to skip the CRC checking operation during an initial decoding operation, and outputting the decoded message to the host via a host interface if no error is detected during the CRC checking operation and the CRC checking operation passes.

9. The memory controller of claim 8, wherein the processor is configured to determine if the third code word passes the CRC checking operation by determining if the first CRC parity and the second CRC parity included therein equals read CRC parities generated based on the decoded message.

10. The memory controller of claim 8, wherein the third code word is decoded to generate the decoded message without the CRC checking operation, if the number of iterations indicates the initial decoding operation.

* * * * *